US011731229B2

(12) United States Patent
Miyahara

(10) Patent No.: US 11,731,229 B2
(45) Date of Patent: Aug. 22, 2023

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventor: Osamu Miyahara, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1372 days.

(21) Appl. No.: 16/136,476

(22) Filed: Sep. 20, 2018

(65) Prior Publication Data

US 2019/0084117 A1    Mar. 21, 2019

(30) Foreign Application Priority Data

Sep. 20, 2017  (JP) ................................. 2017-180542

(51) Int. Cl.
```
B24B 29/00      (2006.01)
H01L 21/67      (2006.01)
B24B 37/005     (2012.01)
B24B 49/00      (2012.01)
H01L 21/687     (2006.01)
H01L 21/306     (2006.01)
```
(52) U.S. Cl.
CPC .......... *B24B 29/005* (2013.01); *B24B 37/005* (2013.01); *B24B 49/006* (2013.01); *H01L 21/30625* (2013.01); *H01L 21/67017* (2013.01); *H01L 21/67046* (2013.01); *H01L 21/67051* (2013.01); *H01L 21/67219* (2013.01); *H01L 21/67253* (2013.01); *H01L 21/68785* (2013.01)

(58) Field of Classification Search
CPC .... B24B 29/005; B24B 37/005; B24B 49/006
See application file for complete search history.

(56) References Cited

U.S. PATENT DOCUMENTS

2003/0032372 A1* 2/2003 Talieh ..................... B24B 21/06
451/41
2014/0150815 A1* 6/2014 Chen ....................... A46B 17/02
15/21.1

FOREIGN PATENT DOCUMENTS

| JP | 2003-347264 | A |   | 12/2003 |           |
|----|-------------|---|---|---------|-----------|
| JP | 2003347264  | A | * | 12/2003 |           |
| JP | 2013-098380 | A |   | 5/2013  |           |
| JP | 2013098380  | A | * | 5/2013  |           |
| JP | 2013-179252 | A |   | 9/2013  |           |
| JP | 2013179252  | A | * | 9/2013  | B08B 1/002 |

(Continued)

*Primary Examiner* — Keath T Chen
*Assistant Examiner* — Margaret Klunk
(74) *Attorney, Agent, or Firm* — Venjuris, P.C.

(57) ABSTRACT

A substrate processing method includes polishing a target surface of a substrate to be polished by moving a polishing brush in a horizontal direction while pressing the polishing brush against the polishing target surface of the substrate which rotates in a horizontal posture around a vertical axis. The polishing is performed while varying a rotation speed of the substrate and a moving speed of the polishing brush such that the rotation speed of the substrate decreases stepwise or continuously and the moving speed of the polishing brush in a radial direction of the substrate decreases stepwise or continuously as a distance from a center of rotation of the substrate measured in the radial direction of the substrate to a center of the polishing brush increases.

17 Claims, 11 Drawing Sheets

(56) References Cited

FOREIGN PATENT DOCUMENTS

| | | | |
|---|---|---|---|
| WO | WO-2004062850 A1 * | 7/2004 | ........... B24B 53/017 |
| WO | 2017/056392 A | 4/2017 | |

* cited by examiner

SUBSTRATE PROCESSING APPARATUS, SUBSTRATE PROCESSING METHOD, AND STORAGE MEDIUM

CROSS-REFERENCE TO RELATED APPLICATION

This application is based on and claims priority from Japanese Patent Application No. 2017-180542, filed on Sep. 20, 2017 with the Japan Patent Office, the disclosure of which is incorporated herein in its entirety by reference.

TECHNICAL FIELD

The present disclosure relates to a technique for polishing a target surface of a substrate, for example, a back surface of the substrate to be polished using a polishing brush.

BACKGROUND

In the manufacture of a semiconductor device, there is an exposure process in which a resist film formed on the surface of a substrate such as a semiconductor wafer is exposed to give a predetermined pattern. At this time, when there is unevenness on the back surface of the substrate, it may cause a defocusing. When there are defects such as burrs, embedment and scratches of an embedding system, which are difficult to remove from the back surface of the substrate, the defects are removed using a polishing brush that carries hard abrasive particles such as diamond before the exposure (see, e.g., Japanese Patent Laid-Open Publication No. 2013-179252).

When the unevenness on a polishing target surface is sufficiently removed, many and/or deep scratches may be generated in a specific region along a radial direction of the substrate (e.g., a central portion or a peripheral edge portion), or the polishing amount per region may become uneven. When a sufficiently uniform and satisfactory polishing is not performed, it may adversely affect subsequent processes.

SUMMARY

An embodiment of the present disclosure provides a substrate processing apparatus that includes: a substrate holding unit configured to hold a substrate in a horizontal direction; a rotation driving unit configured to rotate the substrate holding unit so as to rotate the substrate held by the substrate holding unit around a vertical axis; a polishing brush configured to polish a target surface of the substrate to be polished; a polishing brush moving unit configured to move the polishing brush in a horizontal direction while pressing the polishing brush against the substrate that is rotating while being held by the substrate holding unit; and a controller configured to control an operation of the substrate processing apparatus including the substrate holding unit, the rotation driving unit, and the polishing brush moving unit. The controller controls the rotation driving unit and the polishing brush moving unit such that a rotation speed of the substrate decreases either stepwise or continuously and a moving speed of the polishing brush in a radial direction of the substrate decreases either stepwise or continuously as a distance from a center of rotation of the substrate measured in the radial direction of the substrate to a center of the polishing brush increases.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
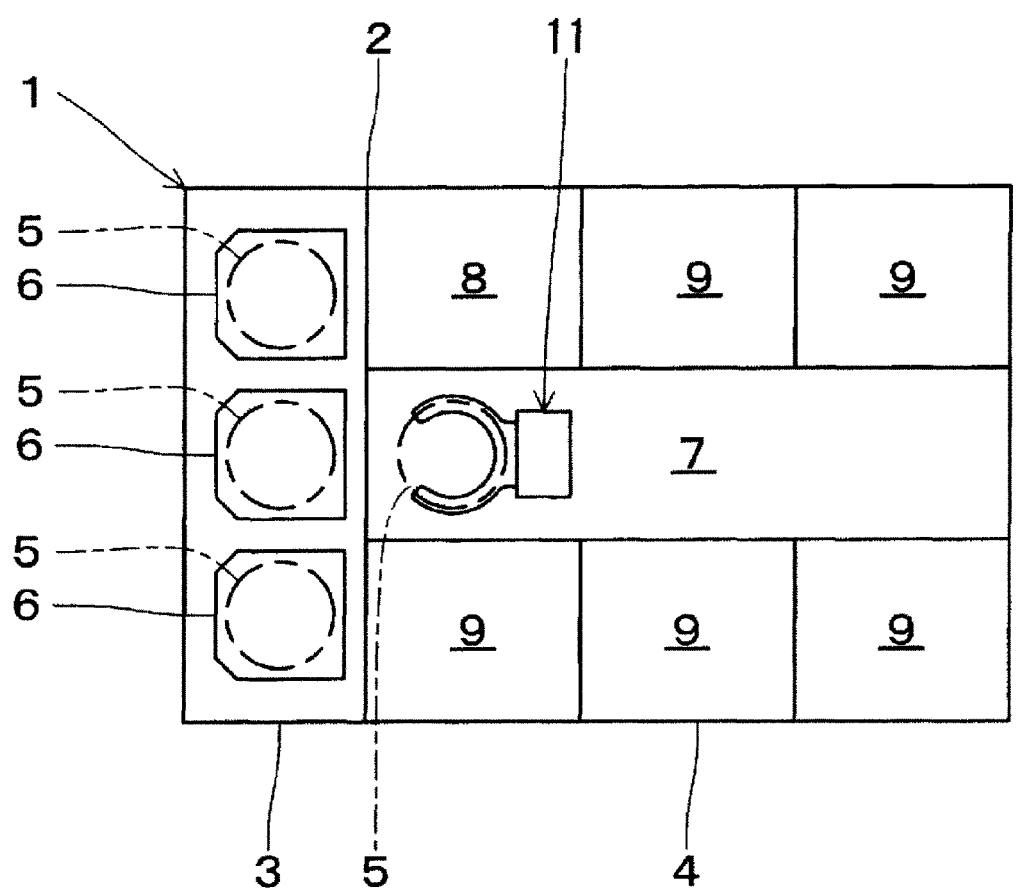
FIG. 1 is a schematic plan view illustrating a unit layout of a substrate processing apparatus.

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

An object of the present disclosure is to provide a technique capable of uniformly polishing a polishing target surface of a substrate.

An embodiment of the present disclosure provides a substrate processing apparatus that includes: a substrate holding unit configured to hold a substrate in a horizontal direction; a rotation driving unit configured to rotate the substrate holding unit so as to rotate the substrate held by the substrate holding unit around a vertical axis; a polishing brush configured to polish a target surface of the substrate to be polished; a polishing brush moving unit configured to move the polishing brush in a horizontal direction while pressing the polishing brush against the substrate that is rotating while being held by the substrate holding unit; and a controller configured to control an operation of the substrate processing apparatus including the substrate holding unit, the rotation driving unit, and the polishing brush moving unit. The controller controls the rotation driving unit and the polishing brush moving unit such that a rotation speed of the substrate decreases either stepwise or continuously and a moving speed of the polishing brush in a radial direction of the substrate decreases either stepwise or continuously as a distance from a center of rotation of the substrate measured in the radial direction of the substrate to a center of the polishing brush increases.

In the above-described substrate processing apparatus, a plurality of ranges in a radial direction are set on the substrate. The controller controls the rotation driving unit and the polishing brush moving unit so as to satisfy conditions that a tangential speed of the substrate at a position of the substrate facing a radially outermost portion of a polishing surface of the polishing brush when the center of the polishing brush is positioned at a radially outermost position of each of the plurality of ranges is equal in each of the plurality of radial ranges, and the conditions that a number of rotations of the substrate during a movement of the polishing brush between positions of the radially outermost side and a radially innermost side of each of the plurality of ranges is equal in each of the plurality of ranges.

In the above-described substrate processing apparatus, the controller controls the rotation driving unit and the polishing brush moving unit such that the rotation speed of the substrate during the movement of the center of the polishing brush in each of the plurality of ranges and the moving speed of the polishing brush in the radial direction of the substrate are constant.

In the above-described substrate processing apparatus, a radial width of each of the plurality of ranges is equal to an outer diameter of the polishing surface of the polishing brush.

In the above-described substrate processing apparatus, the controller moves the polishing brush from a radially inner side to a radially outer side of the substrate when the polishing brush is in contact with the substrate.

The above-described substrate processing apparatus includes at least two polishing brushes. The polishing brush moving unit is configured so as to independently move the at least two polishing brushes, and the controller performs a polishing using one of the at least two polishing brushes when polishing a central region of the substrate, and controls the polishing brush moving unit such that the polishing is performed using the at least two polishing brushes when polishing a peripheral region of the substrate.

Another embodiment of the present disclosure provides a substrate processing method including polishing a target surface of a substrate to be polished by moving a polishing brush in a horizontal direction while pressing the polishing brush against the target surface of the substrate which rotates in a horizontal posture around a vertical axis. The polishing is performed while varying a rotation speed of the substrate and a moving speed of the polishing brush such that the rotation speed of the substrate decreases either stepwise or continuously and the moving speed of the polishing brush in a radial direction of the substrate decreases either stepwise or continuously as a distance from a center of rotation of the substrate measured in the radial direction of the substrate to a center of the polishing brush increases.

In the above-described substrate processing method, a plurality of ranges in a radial direction are set on the substrate and the polishing is performed so as to satisfy a condition that the rotation speed of the substrate during a movement of a center of the polishing brush in each of the plurality of ranges, and the moving speed of the polishing brush in the radial direction of the substrate are constant.

In the above-described substrate processing method, a plurality of ranges is set on the substrate in a radial direction, the polishing is performed so as to satisfy conditions that a tangential speed of the substrate at a position of the substrate facing a radially outermost portion of a polishing surface of the polishing brush when the center of the polishing brush is positioned at a radially outermost position of each of the plurality of ranges is equal in each of the plurality of radial ranges, and the conditions that a number of rotations of the substrate during a movement of the center of the polishing brush between positions of the radially outermost side and a radially innermost side of each of the plurality of ranges is equal in each of the plurality of ranges.

In the above-described substrate processing method, a radial width of each of the plurality of ranges is equal to an outer diameter of the polishing surface of the polishing brush.

In the above-described substrate processing method, the polishing brush is moved from a radially inner side to a radially outer side of the substrate when the polishing brush is in contact with the substrate.

In the above-described substrate processing method, at least two polishing brushes are provided, the at least two polishing brushes are independently moved, and the polishing is performed using one of the at least two polishing brushes when polishing a central region of the substrate, and the polishing is performed using the at least two polishing brushes when polishing a peripheral edge region of the substrate.

Still another embodiment of the present disclosure provides a non-transitory computer-readable storage medium storing a computer executable program that, when executed, causes a computer to execute the above-described substrate processing method.

According to the above-described embodiment, it is possible to equalize the polishing amount over the entire polishing target surface of the substrate since the difference in the peripheral speed between the polishing brushes for each portion of the substrate becomes smaller and the difference in the number of times of polishing for each portion of the substrate becomes smaller.

Hereinafter, a substrate processing apparatus 1 according to an embodiment of the present disclosure will be described with reference to the accompanying drawings.

As illustrated in FIG. 1, the substrate processing apparatus 1 includes a load port (substrate carry-in/carry-out unit) 3 and a processing unit 4.

Carriers 6, which are substrate transport containers, may be stacked on the load port 3 side by side on the left and right. A plurality of (e.g., twenty-five (25)) circular substrates 5 (e.g., semiconductor wafers) are housed in a horizontal posture with a space in the vertical direction with the surface on which the device is formed (surface) facing upward.

A transport path 7 is provided at the center of the processing unit 4 and a substrate transport unit 11 is provided in the transport path 7. One substrate reversing unit (reverser) 8 and five substrate processing units 9 are provided on both sides of the transport path 7. The substrate transport unit 11 may access any arbitrary carrier 6 on the load port 3, the substrate reversing unit 8, and any arbitrary substrate processing unit 9 to transport a substrate 5.

The flow of the substrate 5 in the substrate processing apparatus 1 will be described. The carrier 6 that accommodates the substrate 5 is carried from the outside of the substrate processing apparatus 1 into the load port 3. The substrate transport unit 11 takes out one sheet of substrate 5 from the carrier 6 on the load port 3 and carries the taken sheet of substrate 5 into the substrate reversing unit 8. The substrate reversing unit 8 reverses the substrate 5 so that the surface of the substrate 5 faces downward. Thereafter, the substrate transport unit 11 takes out the substrate 5 from the substrate reversing unit 8 again, and carries the taken substrate 5 into one of the substrate processing units 9. In the substrate processing unit 9, a polishing process is performed on the back surface of the substrate 5 (the surface on which no device is formed). When the polishing process is completed, the substrate transport unit 11 transports the substrate 5 from the substrate processing unit 9 to the substrate reversing unit 8. In the substrate reversing unit 8, the substrate 5 is turned upside down so that the surface of the substrate 5 faces upward. The substrate transport unit 11 takes out the substrate 5 from the substrate reversing unit 8 and accommodates the taken substrate 5 in the original carrier 6 on the load port 3.

Next, the configuration of the substrate processing unit 9 will be described.

Figure 2:
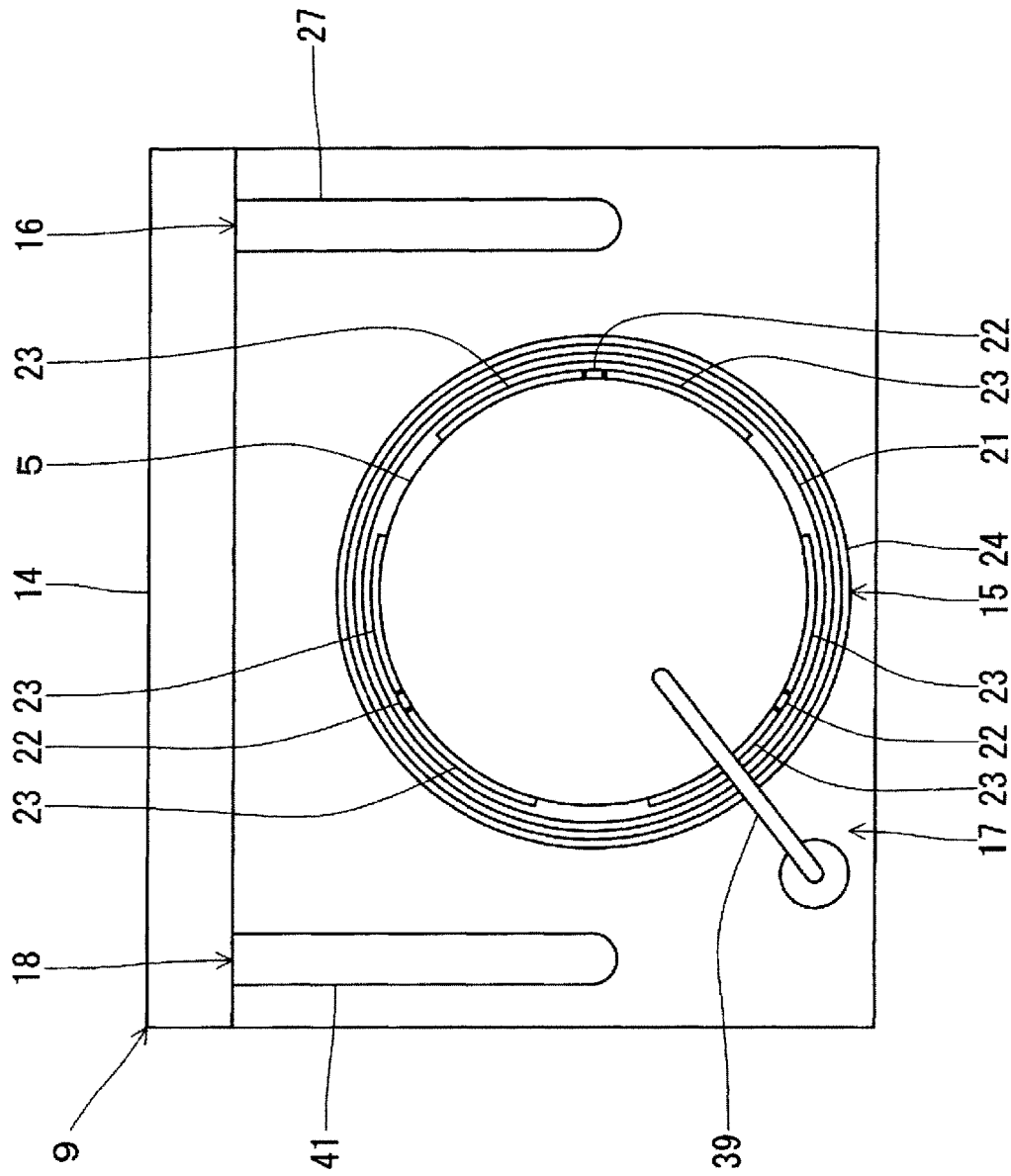
FIG. 2 is a schematic plan view of a substrate processing unit according to an embodiment.
Figure 3:
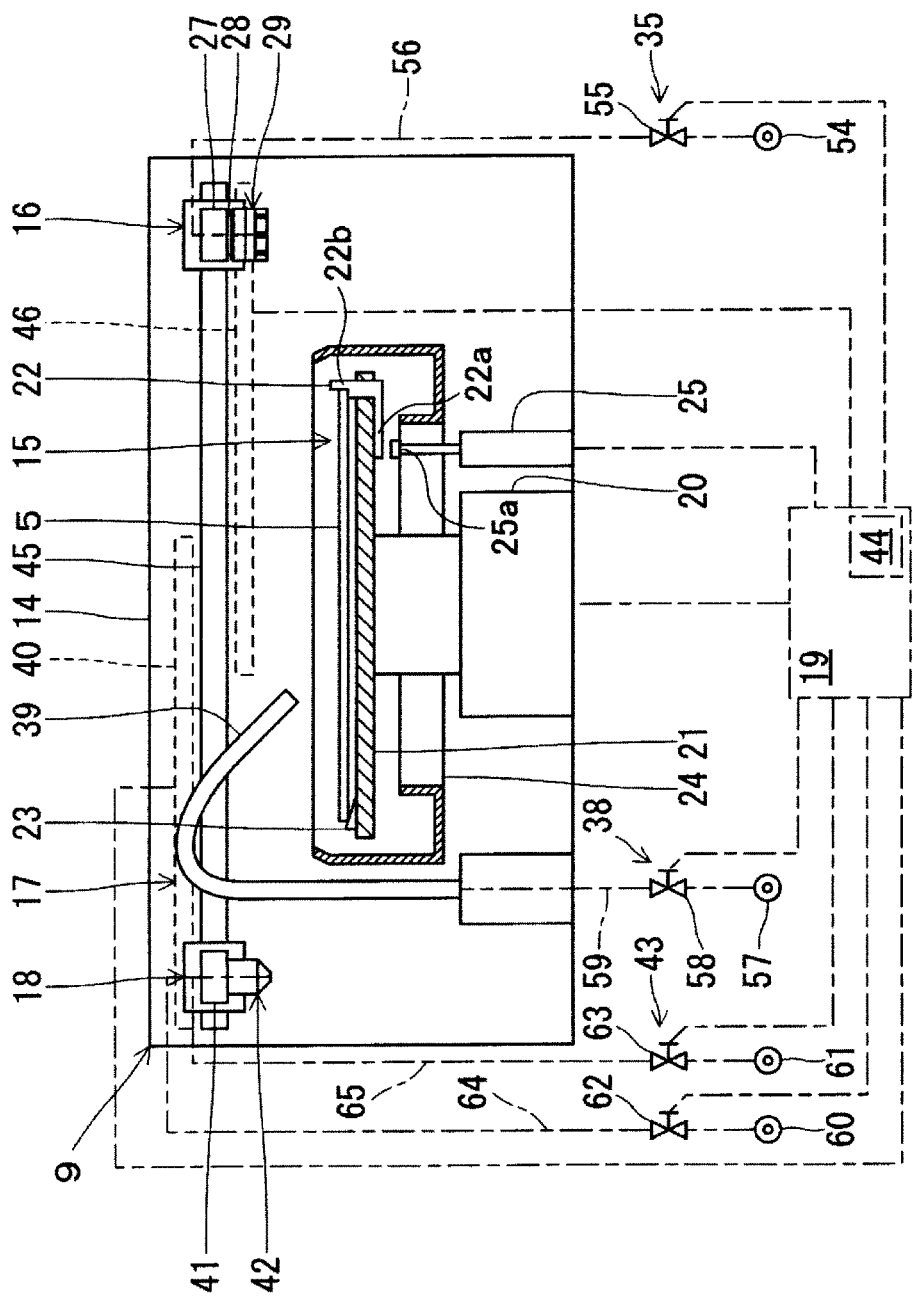
FIG. 3 is a cross-sectional view of the substrate processing unit of FIG. 2.

As illustrated in FIGS. 2 and 3, the substrate processing unit 9 includes a casing 14. A substrate holding and rotating unit (spin chuck) 15, a substrate polishing unit 16, a rinsing liquid supply unit 17, and a substrate cleaning unit 18 are provided in the casing 14.

The substrate holding and rotating unit 15 holds the substrate 5 in a horizontal posture and rotates the held substrate 5 around a vertical axis. The substrate holding and rotating unit 15 includes a rotation driving unit 20 that includes an electric motor and the like and a substrate holding unit that is driven by the rotation driving unit 20, which includes a disk-shaped base plate 21 and a plurality of chucks 22.

A plurality of chucks 22 (only one of which is illustrated in FIG. 3) are arranged at equal intervals in the circumferential direction at the peripheral edge portion of the base plate 21. Each of the chucks 22 is pivotally attached to the base plate 21. An opening/closing mechanism 25 made of, for example, an air cylinder is provided under each of the chucks 22. A holding portion 22b of the chuck 22 is separated from the peripheral edge of the substrate 5 by pushing up a portion to be pressed 22a of the chuck 22 at the tip of a push rod 25a of the opening/closing mechanism 25 while each of the chucks 22 is positioned right above the opening/closing mechanism 25, and thus, the substrate 5 is released. When the push rod of the opening/closing mechanism 25 is separated from the portion to be pressed 22a of the chuck 22, the chuck 22 is rotated due to the weight of the portion to be pressed 22a (by the force of a spring when the spring is provided on the chuck 22), the holding portion 22b of the chuck 22 is pressed against the peripheral edge of the substrate 5, thereby causing the substrate 5 to be held.

A plurality of substrate supports 23 are provided on the peripheral edge portion of the base plate 21 so as to extend in a circular arc in a range where the chuck 22 is not provided. The substrate support 23 has an inclined surface (a surface in contact with the peripheral edge of the substrate 5 in FIG. 3), and the peripheral edge portion of the substrate 5 is placed on the inclined surface.

The periphery of the base plate 21 is covered with a cup 24. The cup 24 receives and collects a processing liquid that splashes outward from the substrate 5 during processing.

Figure 4:
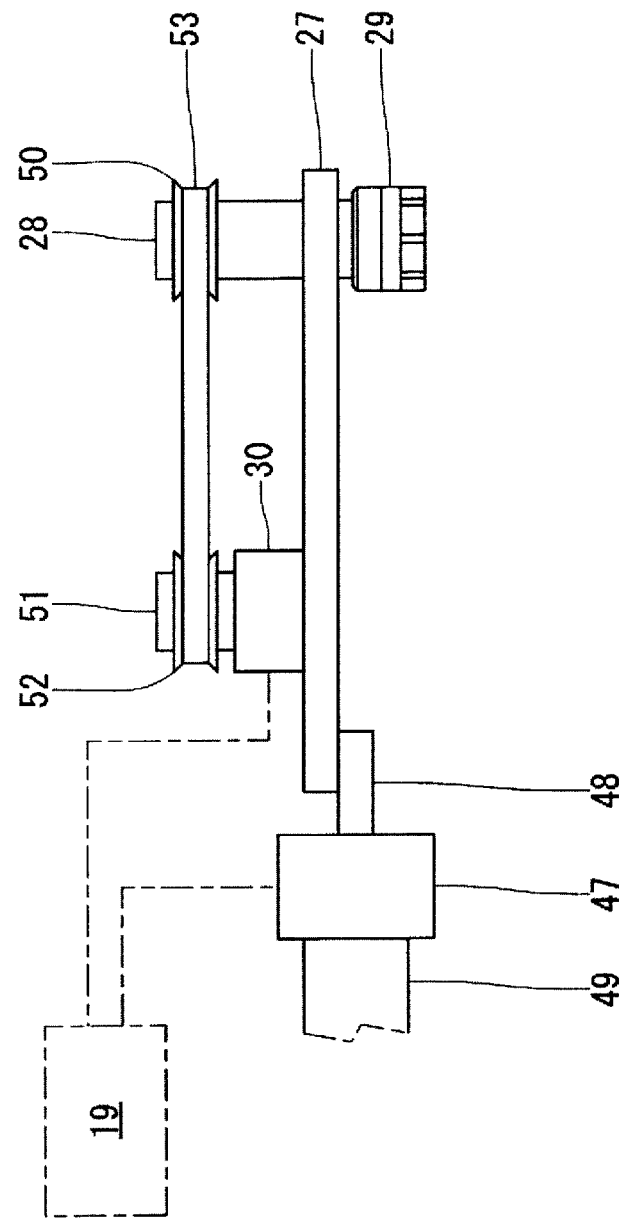
FIG. 4 is a schematic cross-sectional view illustrating a configuration of a substrate polishing unit.

Hereinafter, the configuration of the substrate polishing unit 16 will be described mainly with reference to FIGS. 3 and 4. The substrate polishing unit 16 includes a polishing brush 29 provided on an arm 27. Specifically, a hollow rotary shaft 28 is attached to the front end of the arm 27, and a polishing brush 29 is attached to the lower end of the rotary shaft 28. A rotation motor 30 is mounted on the arm 27. The polishing brush 29 is rotationally driven by a rotation drive mechanism including a drive pulley 52 provided on a rotation shaft of the rotation motor 30, a driven pulley 50 provided on the rotation shaft 28, and a belt 50 provided on the pulleys 50 and 52.

The substrate polishing unit 16 further includes drive mechanisms 46 and 47 that move the arm 27 in a horizontal direction (left and right directions in FIGS. 2 and 3) and in a vertical direction. The arm 27 is attached to an arm base 49 via an arm elevation drive mechanism 47 schematically illustrated in FIG. 4 (made of, e.g., a cylinder). The arm base 49 may move along a guide rail 45 that extends in the horizontal direction within the casing 14 by a scan drive mechanism 46 (made of, e.g., motor-driven ball screws). Based on the above-described configuration, the polishing brush 29 may be moved along a straight line passing through the center of the substrate 5 and the polishing brush 29 may be pressed against the substrate 5 with a desired pressing force.

Figure 5:
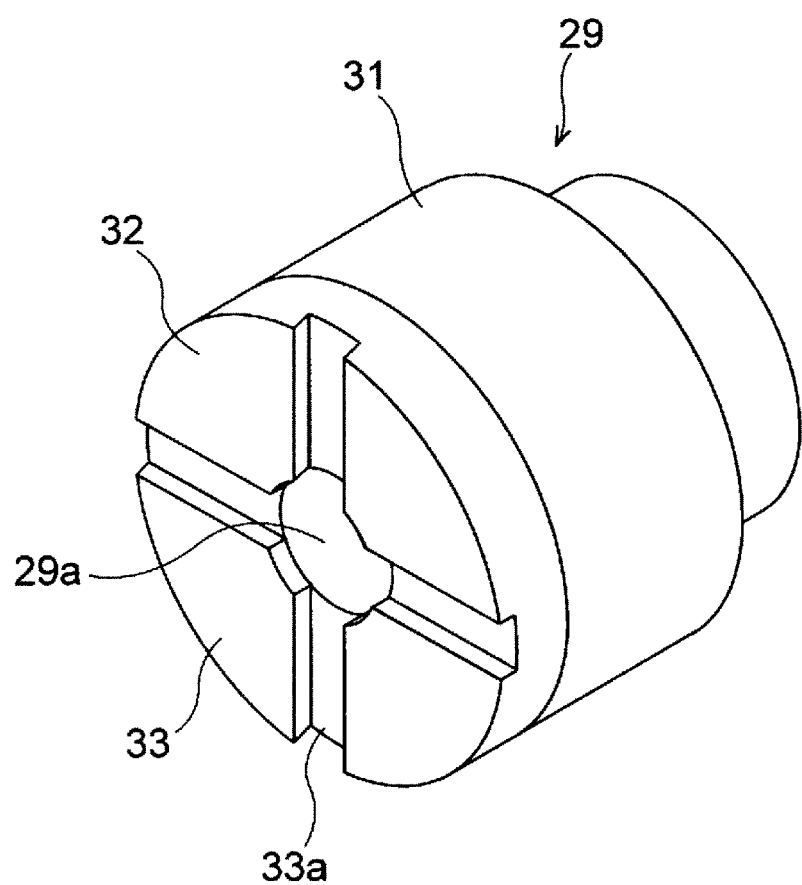
FIG. 5 is a perspective view of a substrate processing brush.

A configuration example of the polishing brush 29 is illustrated in FIG. 5. The polishing brush 29 includes a base portion 31 that is detachably attached to the rotation shaft 28 (not illustrated in FIG. 5) and a polishing member 32 that is provided on the base portion 31. The polishing member 32 may be composed of a base material made of a resin material such as polyvinyl alcohol or phenol resin, and an abrasive layer made of diamond, silicon carbide, or the like. The polishing member 32 has an annular polishing surface 33. The polishing surface 33 is formed with a slit-shaped concave portion 33a provided at equal intervals in a circumferential direction.

The detailed structure of the polishing brush 29 is not limited to that illustrated in FIG. 5. However, as illustrated in FIG. 5, it is general that the polishing surface 33 is not provided at the central portion but is provided at the peripheral edge portion.

A processing liquid (pure water as cooling water which cools the heat generated by abrasive polishing in this case) is supplied to the polishing brush 29 from a processing liquid supply mechanism 35. The processing liquid supply mechanism 35 includes a processing liquid supply pipe 56 provided with a valve 55 from a processing liquid supply source 54. The processing liquid supply pipe 56 is connected to the polishing brush 29 via a known rotational joint (not illustrated). The processing liquid supplied from the processing liquid supply pipe 56 to the polishing brush 29 is supplied to the substrate 5 from a cavity 29a formed in the central portion of the polishing brush 29 and is discharged to the outside of the polishing brush 29 via the slit-shaped concave portion 33a.

As illustrated in FIGS. 2 and 3, the rinsing liquid supply unit 17 includes a rinsing liquid supply nozzle 39 and a rinsing liquid supply mechanism 38 that supplies a rinsing liquid (pure water in this case) to the rinsing liquid supply nozzle 39. The rinsing liquid supply mechanism 38 supplies the rinsing liquid to the rinsing liquid supply nozzle 39 via a rinsing liquid supply pipe 59 provided with a rinsing liquid supply source 57 and a valve 58. The fluid supply nozzle 39 is provided in such a manner that the rinsing liquid discharged therefrom adheres near the center of the substrate 5 and does not directly collide with the moving polishing brush 29.

As illustrated in FIGS. 2 and 3, the substrate cleaning unit 18 includes a substrate cleaning nozzle (two-fluid nozzle) 42 provided at the tip of the arm 41. A base end portion of the arm 41 may be moved in a horizontal direction (in the left and right direction in FIGS. 2 and 3) along the guide rail 45 by a scan drive mechanism 40 (made of, e.g., motor-driven ball screws). It is possible to move the substrate cleaning nozzle 42 along a straight line passing through the rotation center of the substrate 5 based on the above-described configuration.

The substrate cleaning nozzle 42 is connected to a cleaning fluid supply mechanism 43. The cleaning fluid supply mechanism 43 supplies pure water and nitrogen gas to the substrate cleaning nozzle 42 from a pure water supply source 60 and a nitrogen gas supply source 61 via the cleaning liquid supply pipes 64 and 65 provided with the valves 62 and 63, respectively. In the substrate cleaning nozzle 42, the pure water is turned into mist when the pure water joins with the nitrogen gas flow, and a mixed fluid of the pure water and the nitrogen gas (two-fluid) is sprayed from the substrate cleaning nozzle 42 to the substrate 5. The material attached to the surface of the substrate 5 may be efficiently removed by the high kinetic energy of the two-fluid body.

The operations of the units constituting the above-described substrate processing apparatus 1, that is, the substrate transport unit 11, the substrate processing unit 9, the substrate transport unit 8, and the like are controlled by a control device 19. The operations of the movable structural members constituting the respective portions 15 to 18 of the substrate processing unit 9 (such as a motor, a cylinder, and a valve) are also controlled by the control device 19.

The control device 19 is made of a computer and includes a storage medium 44 such as, for example, a hard disk (HD). A program is stored in the storage medium 44 to control various processes executed in the substrate processing apparatus 1. The program may be recorded in a storage medium readable by the computer and may be installed in the storage medium 44 of the control device 19 from the storage medium. Examples of the storage medium readable by a computer include a hard disk (HD), a flexible disk (FD), a compact disk (CD), a magnet optical disk (MO), a memory card, or the like. The substrate processing apparatus 1 executes a polishing procedure of the back surface of the substrate 5 described below under the control of the control device 19 that executes the program.

The backside polishing process of the substrate 5 performed by the substrate processing unit 9 will be described below with reference to FIGS. 6 to 9.

[Carry-In Step]

The substrate transport unit 11 carries the substrate 5 into the substrate processing unit 9 with the back surface of the substrate 5 facing upward and transports the substrate 5 to the substrate holding and rotating unit 15. The substrate 5 is supported on the substrate support 23 in a horizontal posture in a state constrained so that the substrate 5 is not movable horizontally by the chuck 22.

[Preparation Step]

Figure 6:
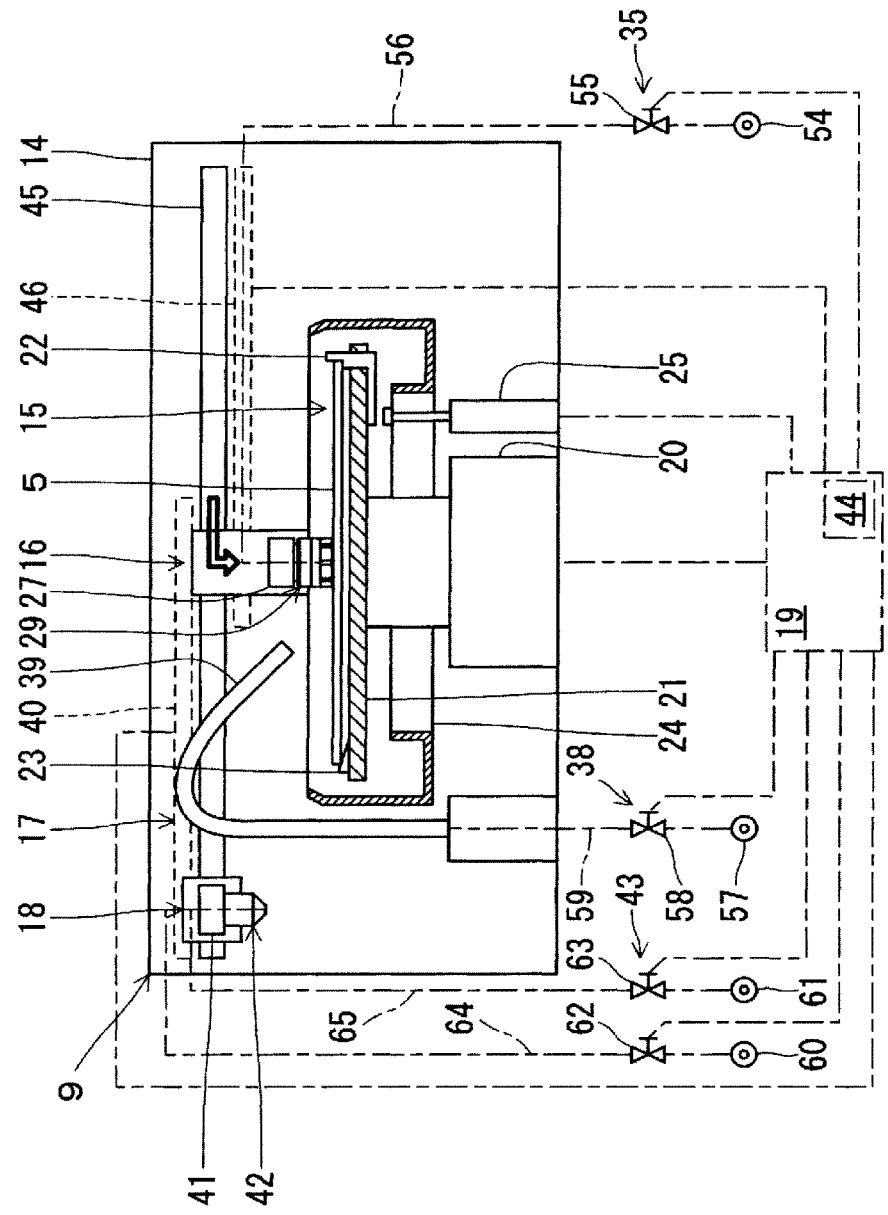
FIG. 6 is an operation diagram for explaining the operation of the substrate processing unit.

Next, the polishing brush 29 is moved from a retracted position (the right end position in FIGS. 6 to 9) to a position spaced upward from the substrate 5 above the central portion of the substrate 5. The substrate cleaning nozzle 42 is kept in the retracted position (the left end position in FIGS. 6 to 9). FIG. 6 illustrates the procedures until this step.

[Polishing Step]

Figure 7:
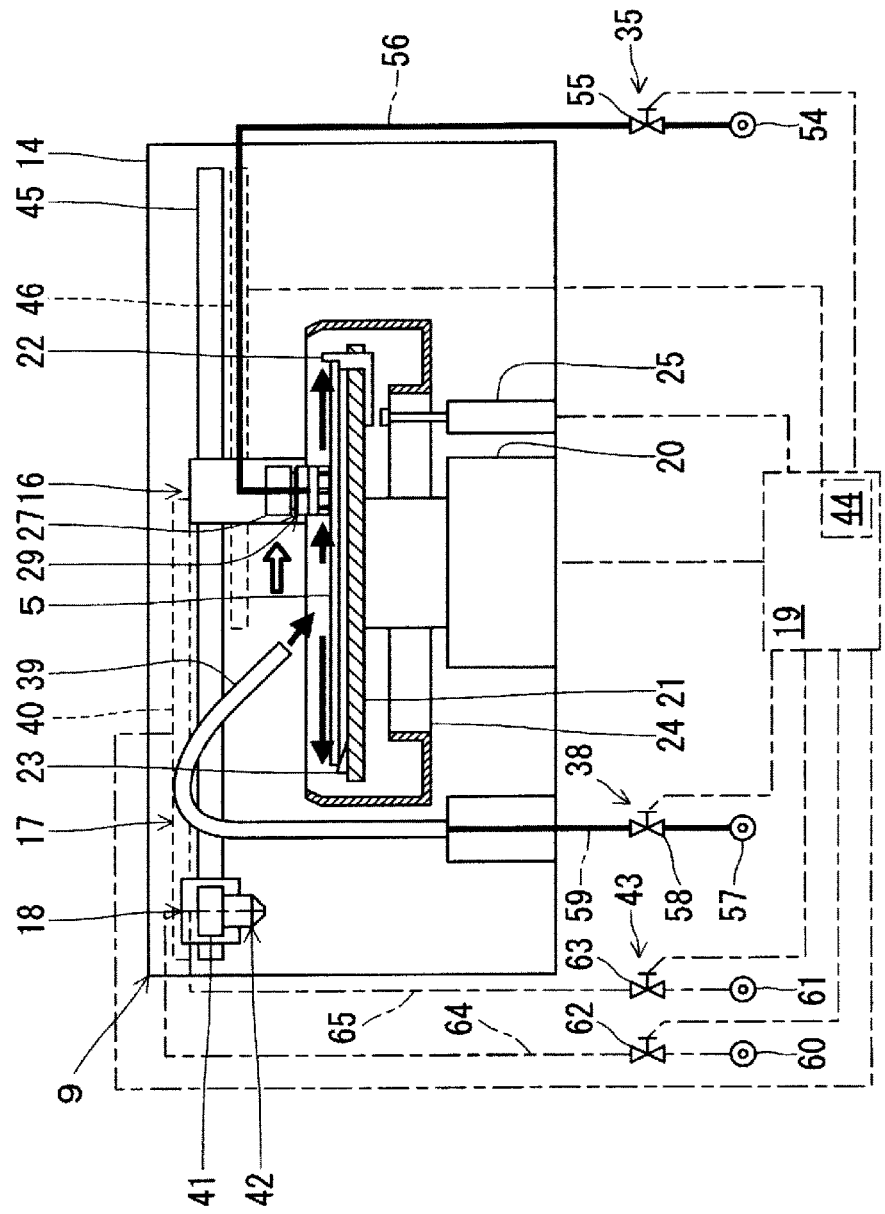
FIG. 7 is an operation diagram for explaining the operation of the substrate processing unit.

Next, the substrate holding and rotating unit 15 rotates the substrate 5 about the vertical axis. The rotation of the substrate 5 continues until the end of the process. Pure water is supplied to the center of the upper surface (back surface) of the substrate 5 from the rinsing liquid supply nozzle 39 and pure water is supplied to the polishing brush 29 from the processing liquid supply mechanism 35. In this state, the polishing brush 29 is rotated and pressed against the upper surface of the substrate 5, and the polishing brush 29 is moved toward the peripheral edge of the substrate 5. As a result, an object to be removed existing on the upper surface of the substrate 5 is cut off by the polishing brush 29. The cut off object to be removed causes the top surface of the rotating substrate 5 to flow toward the peripheral edge of the substrate 5 together with pure water supplied to the substrate 5 from the rinsing liquid supply nozzle 39 and pure water supplied from the processing liquid supply mechanism 35 to the polishing brush 29, and flows to the outside of the substrate 5. FIG. 7 illustrates the procedures until this step. Details of the polishing conditions will be described later.

[Physical Cleaning Step]

Figure 8:
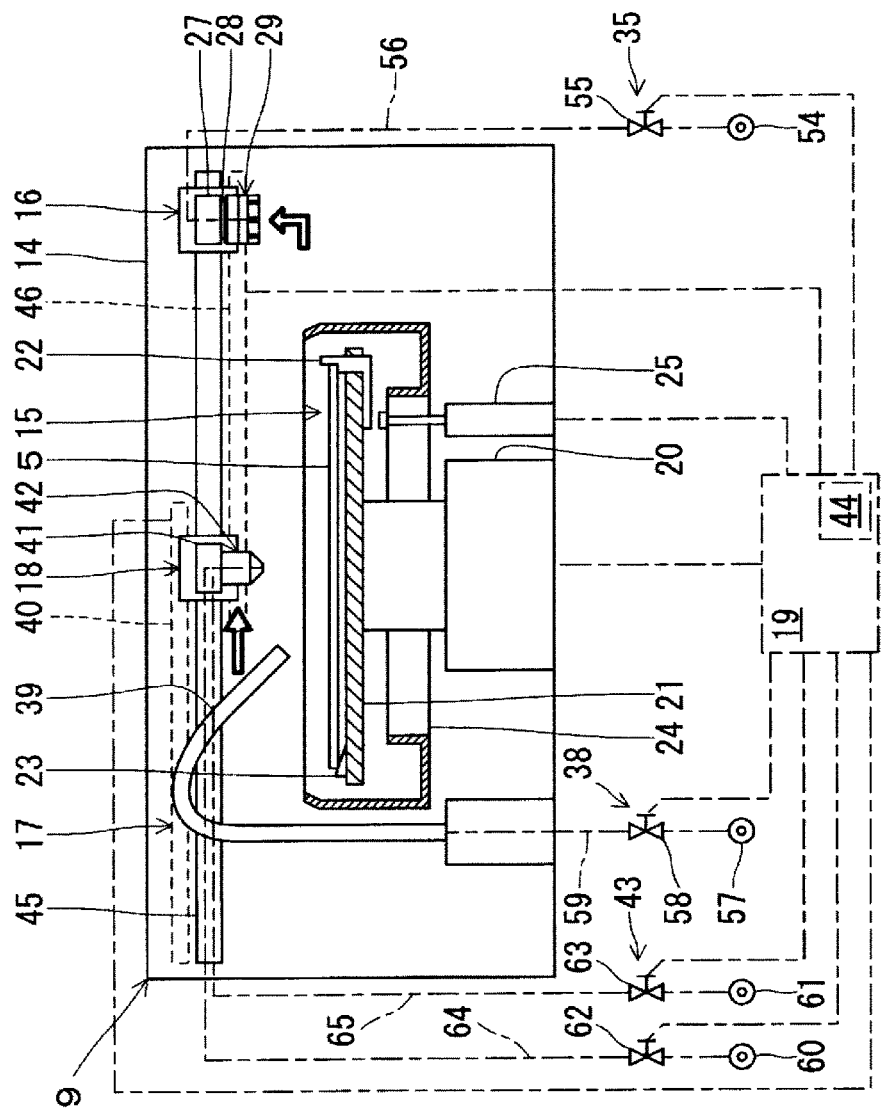
FIG. 8 is an operation diagram for explaining the operation of the substrate processing unit.

Next, the polishing brush 29 is raised to be separated from the upper surface of the substrate 5, the supply of pure water to the polishing brush 29 from the processing liquid supply mechanism 35 is stopped, and the polishing brush 29 is moved to the retracted position (the right end position in FIGS. 6 to 9). Simultaneously with this, the substrate cleaning nozzle 42 is moved from the retracted position to a position directly above the center of the upper surface of the substrate 5. FIG. 8 illustrates the procedures until this step.

Figure 9:
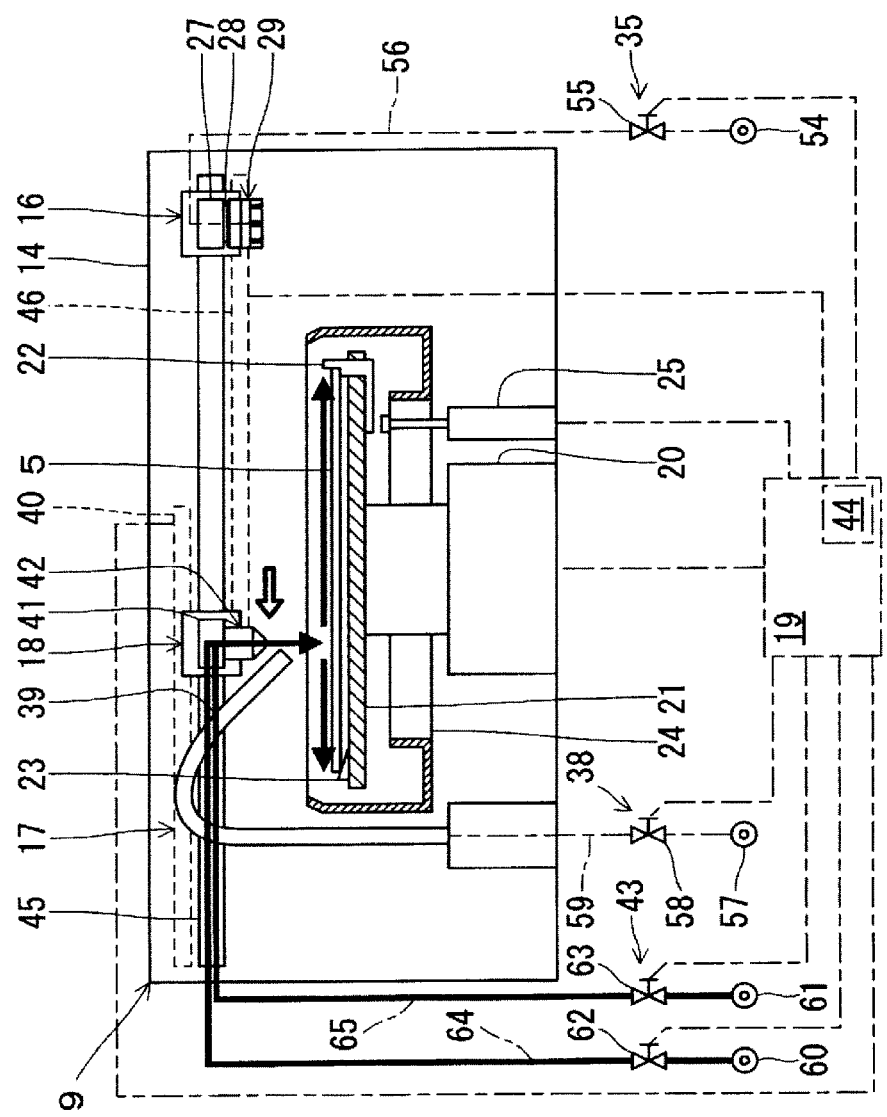
FIG. 9 is an operation diagram for explaining the operation of the substrate processing unit.

Next, a two-fluid body made of a mixed fluid of pure mist and nitrogen gas is sprayed from the substrate cleaning nozzle 42 toward the upper surface of the substrate 5. The substrate cleaning nozzle 42 is moved to the position directly above the peripheral edge of the upper surface of the substrate 5 while the two-fluid body is discharged from the substrate cleaning nozzle 42. The substrate cleaning nozzle 42 may reciprocate between a position directly above the center of the substrate 5 and a position directly above the peripheral edge. Contaminants generated by polishing that are attached to the upper surface of the substrate 5 are removed by the energy of the two-fluid body discharged from the substrate cleaning nozzle 42. FIG. 9 illustrates the procedures until this step.

In the above-described physical cleaning step, the supply of pure water from the rinsing liquid supply nozzle 39, which has been performed in the polishing process, may be continued.

In the above-described physical cleaning step, scrub cleaning may be performed instead of the two-fluid cleaning. In this case, a scrub cleaning unit (not illustrated) is provided instead of the substrate cleaning unit 18 having the substrate cleaning nozzle 42 described above. The scrub cleaning unit is only different from the substrate polishing unit 16 in that the brush to be used does not have an abrasive layer, and the scrub cleaning unit has substantially the same structure as the substrate polishing unit 16. Examples of the brush used in the scrub cleaning unit include a sponge brush made of PVA having no abrasive layer.

[Rinsing Step]

Next, pure water is supplied to the central portion of the back surface of the substrate 5 to perform the rinsing step. In this rinsing step, pure water may be supplied from the rinsing liquid supply nozzle 39 or from the substrate cleaning nozzle 42. When pure water is supplied from the substrate cleaning nozzle 42, only the pure water is supplied without supplying nitrogen gas to the substrate cleaning nozzle 42.

[Drying Step]

Next, the supply of pure water to the upper surface of the substrate 5 is stopped, and the substrate is shaken and dried by continuously rotating the substrate 5 (preferably, increasing the rotation speed). At this time, the polishing brush 29 and the substrate cleaning nozzle 42 are retracted to their respective retracted positions as illustrated in FIG. 3. When the upper surface of the substrate 5 is dried, the rotation of the substrate 5 is stopped.

Subsequently, the substrate transport unit 11 takes out the processed substrate 5 from the substrate processing unit 9. Thus, a series of polishing processes for one substrate is completed.

Embodiment

Next, a specific embodiment of the polishing step actually performed will be described with reference to FIG. 10, and the appropriate conditions and effects of the polishing step will be described based on this specific embodiment.

Figure 10:
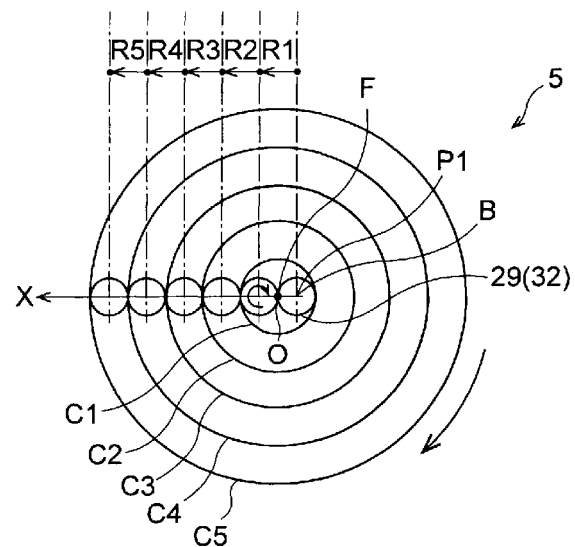
FIG. 10 is a view for explaining a polishing step.

In this embodiment, the substrate 5 and the polishing brush 29 are also rotated in the clockwise direction in FIG. 10. During the period from the start to the end of the polishing step, the rotation speed of the polishing brush 29 is kept constant at 50 rpm, and the brush pressure (the force that presses the polishing brush 29 against the substrate) is kept constant at 1 N. The reason for setting the brush pressure to 1 N is that when the brush pressure is excessively high, abrasive scratches at a problem level are apt to occur, and when the brush pressure is excessively low, the time required for polishing becomes longer. However, since the optimum brush pressure is also influenced by other polishing conditions such as the material of the polishing surface 33 of the polishing brush 29, the size and rotation speed of the polishing brush 29, and the rotation speed of the substrate 5, the brush pressure is not limited to 1 N.

The polishing brush 29 is moved so that a center B of the polishing brush 29 is moved toward the peripheral edge portion of the substrate (toward the left side of FIG. 10 in this example) on the back surface of the circular substrate 5 on a straight line passing through a rotation center O of the substrate 5 (this straight line is also referred to as an "X axis"). The X coordinate of the rotation center O of the substrate 5 is 0 (zero), and the left direction in FIG. 10 is the X positive direction.

In this example, the polishing brush 29 having a diameter D of 30 mm is used. In this case, a plurality of radial ranges are set on the X axis as the movement range of the center B of the polishing brush 29. The X coordinate of a first radial range R1 (unit: mm) is −15 to +15, the X coordinate of a second radial range R2 is +15 to +45, the X coordinate of a third radial range R3 is +45 to +75, the X coordinate of a fourth radial range R4 is +75 to +105, and the X coordinate of a fifth radial range R5 is +105 to +133.

For convenience of explanation, concentric circles C1 to C4 having a diameter N×D (N is a natural number, and D is the diameter of the polishing surface of the polishing brush 29) centered on the rotation center O of the substrate 5 are set on the back surface of the substrate 5. When the substrate 5 is a 12-inch wafer, five concentric circles C1 to C5 are set. The diameter of the circle C1 is 60 mm, the diameter of the circle C2 is 120 mm, the diameter of the circle C3 is 180 mm, the diameter of the circle C4 is 240 mm, and the diameter of the circle C5 is 297 mm The X coordinate of a fifth radial range R05 is "+105 to +133.5," not "+105 to +135" and the outermost circle C5 has a diameter of 297 mm, not 300 mm because there is a peripheral edge region which is not to be polished, such as a bevel portion, on the outermost periphery of the substrate 5 having a diameter of 300 mm <Polishing in First Radial Range R1>

Prior to the start of polishing, the center B of the polishing brush 29 is positioned at a position P1 on the back surface of the substrate 5. The X coordinate at the position P1 is −15. In this case, the X coordinate of the point on the side having a larger X coordinate value among two points on the outer periphery of the polishing surface of the polishing brush 29 on the X axis, that is, the point on the advancing direction side of the polishing brush 29 (hereinafter, referred to as "forefront point F"), is zero. In other words, the forefront point F coincides with the rotation center O of the substrate 5.

In this state, the rotating polishing 29 is brought into contact with the substrate 5 that rotates at a rotation speed of 2,475 rpm to start polishing. When the polishing brush 29 is brought into contact with the substrate 5, the polishing brush 29 is immediately started to move in the X positive direction at the speed of 15 mm/sec of the polishing brush 29, and moved until the X coordinate of the center B becomes +15.

<Polishing in Second Radial Range R2>

When the X coordinate of the center B of the polishing brush 29 becomes +15, that is, when the X coordinate of the forefront point F of the polishing brush 29 becomes +30 and the forefront point F is positioned on the circle C1, the moving speed of the polishing brush 29 in the X positive direction is reduced to 3.8 mm/sec, the rotation speed of the substrate 5 is reduced to 1238 rpm, and the polishing brush 29 is moved until the X coordinate value of the center B becomes +45.

<Polishing in Third Radial Range R3>

When the X coordinate value of the center B of the polishing brush 29 becomes +45, that is, when the X coordinate value of the forefront point F of the polishing brush 29 becomes +60 and the forefront point F is located on the circle C2, the moving speed of the polishing brush 29 in the X positive direction is reduced to 2.5 mm/sec, the rotation speed of the substrate 5 is reduced to 825 rpm, and the polishing brush 29 is moved until the X coordinate value of the center B becomes +75.

<Polishing in Fourth Radial Range R4>

When the X coordinate value of the center B of the polishing brush 29 becomes +75, that is, when the X coordinate value of the forefront point F of the polishing brush 29 becomes +90 and the forefront point F is located on the circle C3, the moving speed of the polishing brush 29 in the X positive direction is reduced to 1.9 mm/sec, the rotation speed of the substrate 5 is reduced to 619 rpm, and the polishing brush 29 is moved until the X coordinate value of the center B becomes +105.

<Polishing in Fifth Radial Range R5>

When the X coordinate value of the center B of the polishing brush 29 becomes +105, that is, when the X coordinate value of the forefront point F of the polishing brush 29 becomes +120 and the forefront point F is located on the circle C4, the moving speed of the polishing brush 29 in the X positive direction is reduced to 1.4 mm/sec, the rotation speed of the substrate 5 is reduced to 500 rpm, and the polishing brush 29 is moved until the X coordinate value of the center B becomes +135. When the X coordinate value of the center B of the polishing brush 29 becomes +133.5, that is, when the X coordinate value of the forefront point F of the polishing brush 29 becomes +148.5 and the forefront point F is located on the circle C5, the polishing brush 29 is raised to be separated from the back surface of the substrate 5.

Table 1 below represents the polishing conditions for each of the radial ranges.

TABLE 1

| Radial Range | R1 | R2 | R3 | R4 | R5 |
|---|---|---|---|---|---|
| Center Position of Brush (mm) | −15~+15 | −15~+45 | +45~+75 | +75~+105 | +105~+133.5 |
| Rotation Speed of Substrate (rpm) | 2475 | 1238 | 825 | 619 | 500 |
| Tangential Speed (mm/sec) | 7775.4 | 7775.4 | 7775.4 | 7775.4 | 7775.4 |
| Moving Speed of Brush (mm/sec) | 15 | 3.8 | 2.5 | 1.9 | 1.4 |
| Time Required to Move (sec) | 2.0 | 8.0 | 12.0 | 16.0 | 19.8 |
| Number of Times of Polishing (round) | 165 | 165 | 165 | 165 | 165 |

The "tangential speed" represented in Table 1 indicates the tangential speed of the substrate 5 at the X coordinate at which the forefront point F of the polishing brush 29 is located at the end when the X coordinate of the center B of the polishing brush 29 is maximum in each of the radial ranges R1 to R5 (when the center B of the polishing brush 29 is located at the end in the travel direction in the radial range (radially outward position)). As represented in Table 1 above, the tangential speed of the polishing in all the radial ranges R1 to R5 is 7775.4 mm/sec and is identical.

In this embodiment, the substrate 5 and the polishing brush 29 are rotated in the clockwise direction illustrated in FIG. 10, but the polishing brush 29 may be rotated in a direction opposite to the rotation direction of the substrate 5 (counterclockwise direction).

In Table 1, the "time spent for moving" is the time required for the center B of the polishing brush 29 to move from the end to the end of the radial range to the end in each of the radial ranges. "Polishing frequency" is the number of rotations of the substrate 5 within each of the above-described "time spent for moving."

The haze value is used as an evaluation criterion of the flatness of the back surface of the substrate 5. The haze value is usually used to evaluate the diffusibility of the transmitted light, but here, the haze value is used to evaluate the diffusibility of the reflected light. When the back surface of the substrate 5 is ideally flattened, the haze value is close to zero. However, when the back surface of the substrate 5 has many and/or deep abrasive scratches, since diffusion increases, the haze value becomes higher.

Figure 11:
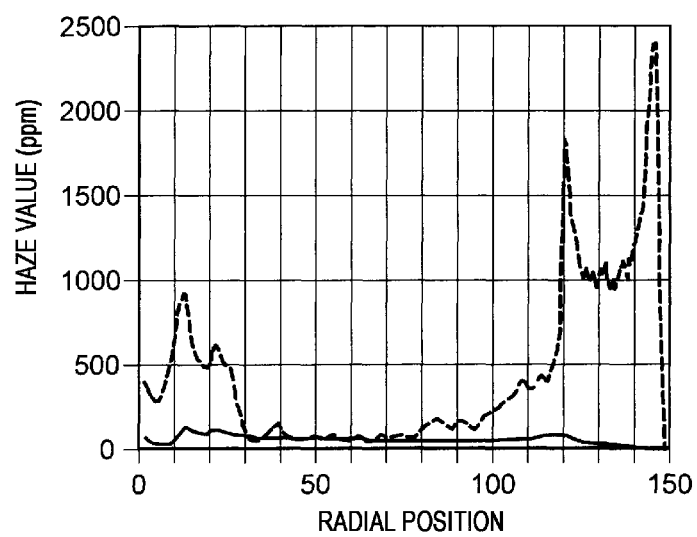
FIG. 11 is a graph illustrating a haze value distribution on the back surface of a substrate in an example and a comparative example.

The radial distribution of the haze value on the back surface of the substrate 5 polished by the above-described polishing conditions is indicated with a solid line in FIG. 11. The haze value is low over the entire area of the back surface of the substrate 5 and the polishing is uniformly performed over the entire area of the back surface of the substrate 5.

From the above-described embodiment, the following may be known.

It is preferable that the rotation speed of the substrate 5 is reduced as the position of the polishing brush 29 is separated from the center of rotation of the substrate (the X coordinate becomes larger). In this manner, the tangential speed of the substrate 5 at the contact point of the substrate 5 of the polishing brush 29 (which may be also referred to the relative moving speed of the polishing brush 29 with respect to the substrate 5) may be equalized regardless of the radial position of the polishing brush 29 (the distance from the rotation center O of the substrate 5 to the center B of the polishing brush 29). Since the tangential speed has a great influence on the amount of polishing, it is advantageous to equalize the tangential speed to equalize the amount of polishing.

It is preferable that the moving speed of the polishing brush 29 in the X axis direction (the radial direction of the substrate 5) is reduced as the rotation speed of the substrate 5 is reduced as the position of the polishing brush 29 is separated from the rotation center of the substrate as described above. By doing so, it is possible to equalize the number of times of polishing for each portion of the substrate 5 regardless of the change in the rotation speed of the substrate 5. Since the number of times of polishing also has a great influence on the amount of polishing, it is advantageous to equalize the number of times of polishing in order to equalize the amount of polishing.

Actually, in the above-described embodiment, the rotation speed of the substrate 5 and the moving speed of the polishing brush 29 in the X axis direction are constant regardless of the change of the X coordinate in each of the radial ranges R1 to R5, and the rotation speed of the substrate 5 and the moving speed of the polishing brush 29 in the X axis direction are changed when shifting from a certain range to the neighboring range. In other words, the rotation speed of the substrate 5 and the movement speed of the polishing brush 29 in the X axis direction are changed stepwise (step by step) in accordance with the increase in the X coordinate of the center of the polishing brush 29. It is clear from the above-described embodiment that the amount of polishing may be equalized sufficiently by stepwise controlling the rotation speed of the substrate 5 and the moving speed of the polishing brush 29 in the X axis direction.

The width of one radial range (the rotation speed of the substrate 5 and the moving speed of the polishing brush 29 in the X axis direction are constant in one radial range) is not limited to the above-mentioned 30 mm (which is the same as the diameter of the polishing surface of the polishing brush 29), but may be set to a smaller width, for example, 15 mm When the width of one radial range is made smaller, it is possible to further equalize the polishing amount over the entire area of the back surface of the substrate 5. The rotation speed of the substrate 5 and the moving speed of the polishing brush 29 in the X axis direction may be substantially and continuously changed by narrowing the width of one radial range to an extreme limit.

However, since the control becomes more complicated as the width of one radial range is made smaller, the width of one radial range may be as wide as the diameter of the polishing surface of the polishing brush 29, as described above, when the uniformity of the desired polishing amount is obtained. The width of one radial range may be increased to be larger than the diameter of the polishing surface of the polishing brush 29, when the uniformity of the desired polishing amount is obtained.

In the above-described embodiment, the rotation speed of the substrate 5 and the moving speed of the polishing brush 29 in the X axis direction are constant, but at least one of the rotation speed of the substrate 5 and the moving speed of the polishing brush 29 in the X axis direction may be changed stepwise or continuously.

COMPARATIVE EXAMPLE

The results of polishing by the method in the related art will be explained as a comparative example. During the period from the start to the end of the polishing step, the rotation speed of the substrate is constant at 1000 rpm, the rotation number of the polishing brush is constant at 50 rpm, and the brush pressure (force to press the polishing brush onto the substrate) is made constant at 1 N. In this comparative example, three radial ranges (first to third radial ranges), which are different from the above-described embodiment, are set.

<Polishing in First Radial Range>

Prior to the start of polishing, the center B of the polishing brush 29 is positioned at the position P1 on the X axis on the back surface of the substrate 5 (see, e.g., FIG. 10), as in the above-described embodiment. The X coordinate at the position P1 is −15. The X coordinate of the forefront point F of the polishing brush 29 is zero. In other words, the forefront point F coincides with the rotation center O of the substrate 5.

In this state, the rotating polishing brush 29 is brought into contact with the rotating substrate 5 to start polishing. When the polishing brush 29 is brought into contact with the substrate 5, the polishing brush 29 is immediately moved in the X positive direction at a speed of 15 mm/sec and the polishing brush 29 is moved until the X coordinate of the center B becomes +35. The required movement time of the polishing brush 29 in the first radial direction range (−15 to +35) is 3.3 sec.

<Polishing in Second Radial Range>

When the X coordinate of the center B of the polishing brush 29 becomes +35, the moving speed of the polishing brush 29 in the X positive direction is changed to 10 mm/sec, and the X coordinate value of the center B of the polishing brush 29 becomes +85. The required movement time of the polishing brush 29 in the second radial range (+35 to +85) is 5.0 sec.

<Polishing in Third Radial Range>

When the X coordinate of the center B of the polishing brush 29 becomes +85, the moving speed of the polishing brush 29 in the X positive direction is changed to 7 mm/sec, and the polishing brush 29 is moved until the X coordinate value of the center B thereof becomes +133.5. The required movement time of the polishing brush 29 in the third radial range (+85 to +133.5) is 6.9 sec. Thereafter, the polishing brush 29 is held at the position for 4 sec.

The distribution in the radial direction of the haze value on the back surface of the substrate 5 polished by the above-described polishing conditions is indicated by a broken line in FIG. 11. It may be seen that the haze value is increased at the central portion and the peripheral edge portion of the back surface of the substrate 5, and that many and/or deep scratches are formed and the uniformity of polishing is low. Further, many and/or deep scratches are formed in the peripheral edge portion of the back surface of the substrate 5 because the polishing brush 29 is held for 4 seconds at the peripheral edge portion. When the peripheral edge portion is excluded from an evaluation object and the evaluation is made for the other portions, it may be seen that the comparative example is clearly inferior to the uniformity of polishing in the above-described embodiment.

OTHER EMBODIMENTS

Figure 12A:
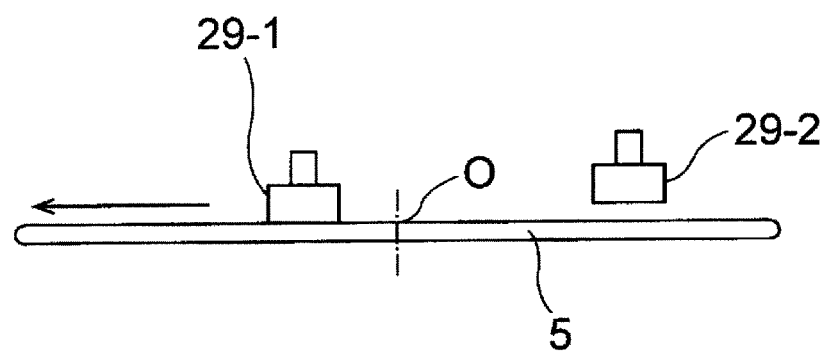
FIGS. 12A and 12B are views for explaining a polishing step according to another embodiment.
Figure 12B:
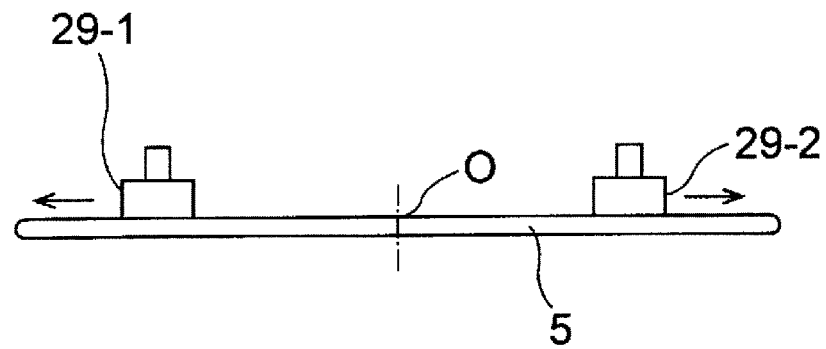

As is clear from Table 1, in the above-described embodiment, since the moving speed of the polishing brush 29 in the X axis direction at the peripheral edge side of the substrate 5 is suppressed to be small, a relatively long period of time of 16 to 20 seconds is required to polish the peripheral edge region of the substrate 5 (e.g., the regions corresponding to the radial ranges R4 and R5). In order to solve this problem, as illustrated schematically in FIGS. 12A and 12B, two (two or more) polishing brushes 29 may be provided in one substrate processing unit 9 (in FIGS. 12A and 12B, one side is denoted by reference numeral 29-1 and the other side is denoted by reference numeral 29-2). These two polishing brushes 29-1 and 29-2 may be moved independently of each other.

The central region of the substrate 5 (e.g., the regions corresponding to the radial ranges R1 to R3) is polished using only one polishing brush 29-1, and the peripheral edge region of the substrate 5 (e.g., the regions corresponding to the radial ranges R4 and R5) is polished simultaneously using two polishing brushes 29-1 and 29-2. The first polishing brush 29-1 operates in the same manner as the above-described embodiment. When the first polishing brush 29-1 finishes polishing the region on the back surface of the substrate 5 corresponding to the radial range R3, the second polishing brush 29-2 (see, e.g., FIG. 12A), which is on standby on the upper side of the substrate 5, is pressed against the substrate 5, and polishing by the second polishing brush 29-2 is started. The second polishing brush 29-2 is moved in the X axis negative direction so as to be located at a point-symmetric position with respect to the rotation center of the substrate 5 with respect to the first polishing brush 29-1 (see, e.g., FIG. 12B). When using two polishing brushes 29 (29-1 and 29-2) at the same time, the moving speed of the polishing brush in the X axis direction may be doubled when only one polishing brush 29 is used at the same time (under the condition that the same polishing amount is secured). Therefore, the time required for the polishing process may be shortened.

In the above-described embodiment, the polishing brush 29 pressed against the back surface of the substrate 5 is moved (scanned) only once from the central portion of the substrate 5 toward the peripheral edge portion. However, the present disclosure is not limited to this and the substrate 5 may be moved two or more times. In this case, after the first scan is finished, the polishing brush 29 is separated from the back surface of the substrate 5 and returned to right above the central portion of the substrate 5. Thereafter, the second scan may be performed in the same order as the first scan. The third and subsequent scans may be performed in the same way.

In the above-described embodiment, although the polishing brush 29 pressed against the back surface of the substrate 5 is moved from the central portion of the substrate 5 toward the peripheral edge portion. However, the present disclosure is not limited to this and the polishing brush 29 may be moved from the peripheral edge portion of the substrate 5 to the central portion thereof. However, in this case, the polishing brush 29 may be moved from the central portion of the substrate 5 toward the peripheral edge portion since there is a high possibility that the particles cut out from the substrate 5 are caught by the polishing brush 29.

In above-described embodiment, before the substrate 5 is carried into the substrate processing unit 9, the substrate is reversed by the substrate reversing unit 8, and the polishing process in the substrate processing unit 9 is performed from above the substrate. However, the present disclosure is not limited to this and the polishing process may be performed from the bottom of the substrate. In this case, for example, the substrate processing unit 9 may be provided with a substrate holding unit that holds the substrate 5 from above in place of the substrate holding unit 21 and 22, and the back surface of the rotating substrate 5 may be polished by the polishing brush that moves below the substrate 5 held by the substrate holding unit.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus comprising:
    a substrate holder configured to hold a substrate in a horizontal direction;
    a rotation driver configured to rotate the substrate holder so as to rotate the substrate held by the substrate holder around a vertical axis;
    a polishing brush configured to polish a target surface of the substrate, the polishing brush including a forefront point on a radially outermost portion of a polishing surface of the polishing brush facing an advancing direction of the polishing brush;
    a polishing brush mover configured to move the polishing brush in a horizontal direction while pressing the polishing brush against the substrate that is rotating while being held by the substrate holder; and
    a controller configured to control an operation of the substrate processing apparatus including the substrate holder, the rotation driver, and the polishing brush mover, and to establish an initial position where the polishing brush is first pressed against the substrate,
    wherein the forefront point of the polishing brush coincides with the center of rotation of the substrate in the initial position, and
    wherein the controller is configured to:
        bring the polishing brush into contact with the substrate at the initial position,
        move the polishing brush in the advancing direction from the initial position to a radially outer side of the substrate when the polishing brush is in contact with the substrate, and
        control the rotation driver and the polishing brush mover such that a rotation speed of the substrate decreases either stepwise or continuously and a moving speed of the polishing brush in a radial direction of the substrate decreases either stepwise or continuously as a distance from a center of rotation of the substrate measured in the radial direction of the substrate to a center of the polishing brush increases as the polishing brush is moved along the advancing direction from the initial position to the radially outer side of the substrate.

2. The substrate processing apparatus of claim 1, wherein a plurality of ranges is set on the substrate in a radial direction,
    the controller controls the rotation driver and the polishing brush mover so as to satisfy conditions that a tangential speed of the substrate at a position of the substrate coinciding with the forefront point of the polishing brush when the center of the polishing brush is positioned at a radially outermost position of each of the plurality of ranges is equal in each of the plurality of radial ranges, and to satisfy conditions that a number of rotations of the substrate during a movement of the center of the polishing brush between positions of the radially outermost side and a radially innermost side of each of the plurality of ranges is equal in each of the plurality of ranges.

3. The substrate processing apparatus of claim 2, wherein the controller controls the rotation driver and the polishing brush mover such that during the movement of the center of the polishing brush in each of the plurality of ranges, the rotation speed of the substrate and the moving speed of the polishing brush in the radial direction of the substrate are constant.

4. The substrate processing apparatus of claim 2, wherein a radial width of each of the plurality of ranges is equal to an outer diameter of the polishing surface of the polishing brush.

5. The substrate processing apparatus of claim 2, wherein the polishing brush has a rotation axis that extends in the vertical direction,
    the polishing brush mover is further configured to rotate the polishing brush about the rotation axis, and
    the controller further controls the polishing brush mover to rotate the polishing brush at a constant speed about the rotation axis while satisfying the conditions for the tangential speed being equal in each of the plurality of radial ranges.

6. The substrate processing apparatus of claim 1, wherein the substrate processing apparatus includes at least two polishing brushes,
    the polishing brush mover is configured so as to independently move the at least two polishing brushes, and
    the controller performs a polishing using one of the at least two polishing brushes when polishing a central region of the substrate, and controls the polishing brush mover such that the polishing is performed using the at least two polishing brushes when polishing a peripheral edge region of the substrate.

7. A substrate processing apparatus comprising:
    a substrate holder configured to hold a substrate in a horizontal direction;
    a rotation driver configured to rotate the substrate holder so as to rotate the substrate held by the substrate holder around a vertical axis;
    a polishing brush configured to polish a target surface of the substrate;
    a polishing brush mover configured to move the polishing brush in a horizontal direction while pressing the polishing brush against the substrate that is rotating while being held by the substrate holder; and
    a controller configured to control an operation of the substate processing apparatus including the substrate holder, the rotation driver, and the polishing brush mover,
    wherein the polishing brush includes a polishing surface carrying abrasive particles,
    the controller is configured to set a plurality of ranges on the substrate in a radial direction,
    the controller is configured to control the rotation driver and the polishing brush mover so as to satisfy conditions that a rotation speed of the substrate decreases either stepwise or continuously and a moving speed of the polishing brush in a radial direction of the substrate decreases either stepwise or continuously as a distance from a center of rotation of the substrate measured in the radial direction of the substrate to a center of the polishing brush increases, to satisfy conditions that a tangential speed of the substrate at a position of the substrate facing a radially outermost portion of a polishing surface of the polishing brush when the center of the polishing brush is positioned at a radially outermost position of each of the plurality of ranges is equal in each of the plurality of ranges, and to satisfy conditions that a number of rotations of the substrate during a movement of the center of the polishing brush between positions of the radially outermost side and a radially innermost side of each of the plurality of ranges is equal in each of the plurality of ranges.

8. The substrate processing apparatus of claim 7, wherein the controller is configured to control the rotation driver and the polishing brush mover such that during the movement of the center of the polishing brush in each of the plurality of ranges, the rotation speed of the substrate and the moving speed of the polishing brush in the radial direction of the substrate are constant.

9. The substrate processing apparatus of claim 7, wherein a radial width of each of the plurality of ranges is equal to an outer diameter of the polishing surface of the polishing brush.

10. The substrate processing apparatus of claim 7, wherein the controller is configured to move the polishing brush from a radially inner side to a radially outer side of the substrate when the polishing brush is in contact with the substrate.

11. The substrate processing apparatus of claim 7, wherein the substrate processing apparatus includes at least two polishing brushes,
the polishing brush mover is configured so as to independently move the at least two polishing brushes, and
the controller is configured to perform a polishing using one of the at least two polishing brushes when polishing a central region of the substrate, and control the polishing brush mover such that the polishing is performed using the at least two polishing brushes when polishing a peripheral edge region of the substrate.

12. A substrate processing method comprising:
polishing a target surface of a substrate to be polished by moving a polishing brush along an advancing direction from an initial position to a radially outer side of the substrate in a horizontal direction while pressing the polishing brush against the target surface of the substrate which rotates in a horizontal posture around a vertical axis,
wherein the polishing brush includes a forefront point on a radially outermost portion of a polishing surface of the polishing brush facing the advancing direction of the polishing brush and the forefront point of the polishing brush coincides with the center of rotation of the substrate in the initial position, and
wherein the polishing is performed while varying a rotation speed of the substrate and a moving speed of the polishing brush such that the rotation speed of the substrate decreases either stepwise or continuously and the moving speed of the polishing brush in a radial direction of the substrate decreases either stepwise or continuously as a distance from a center of rotation of the substrate measured in the radial direction of the substrate to a center of the polishing brush increases as the polishing brush is moved along the advancing direction from the initial position to the radially outer side of the substrate.

13. The substrate processing method of claim 12, wherein a plurality of ranges are set on the substrate in a radial direction, and
the polishing is performed so as to satisfy a condition that during a movement of a center of the polishing brush in each of the plurality of ranges, the rotation speed of the substrate and the moving speed of the polishing brush in the radial direction of the substrate are constant.

14. The substrate processing method of claim 12, wherein a plurality of ranges is set on the substrate in a radial direction,
the polishing is performed so as to satisfy conditions that a tangential speed of the substrate at a position of the substrate coinciding with the forefront point of the polishing brush when the center of the polishing brush is positioned at a radially outermost position of each of the plurality of ranges is equal in each of the plurality of radial ranges, and to satisfy conditions that a number of rotations of the substrate during a movement of the center of the polishing brush between positions of the radially outermost side and a radially innermost side of each of the plurality of ranges is equal in each of the plurality of ranges.

15. The substrate processing method of claim 14, wherein a radial width of each of the plurality of ranges is equal to an outer diameter of the polishing surface of the polishing brush.

16. The substrate processing method of claim 12, wherein at least two polishing brushes are provided,
the at least two polishing brushes are independently moved, and
the polishing is performed using one of the at least two polishing brushes when polishing a central region of the substrate, and the polishing is performed using the at least two polishing brushes when polishing a peripheral edge region of the substrate.

17. A non-transitory computer-readable storage medium storing a computer executable program that, when executed, causes a computer to execute the substrate processing method of claim 12.

* * * * *